(12) United States Patent
Yun et al.

(10) Patent No.: US 10,600,486 B2
(45) Date of Patent: Mar. 24, 2020

(54) SEMICONDUCTOR MEMORY DEVICE AND METHOD OF OPERATING THE SAME

(71) Applicant: SK hynix Inc., Gyeonggi-do (KR)

(72) Inventors: Dae Hwan Yun, Chungcheongbuk-do (KR); Myeong Won Lee, Gyeonggi-do (KR)

(73) Assignee: SK hynix Inc, Gyeonggi-do (KR)

( * ) Notice: Subject to any disclaimer, the term of this patent is extended or adjusted under 35 U.S.C. 154(b) by 0 days.

(21) Appl. No.: 15/798,525

(22) Filed: Oct. 31, 2017

(65) Prior Publication Data

US 2018/0294034 A1 Oct. 11, 2018

(30) Foreign Application Priority Data

Apr. 10, 2017 (KR) .................. 10-2017-0046141

(51) Int. Cl.
| | |
|---|---|
| *G11C 16/16* | (2006.01) |
| *G11C 16/24* | (2006.01) |
| *G11C 16/08* | (2006.01) |
| *G11C 16/04* | (2006.01) |
| *G11C 16/32* | (2006.01) |
| *G11C 16/30* | (2006.01) |

(52) U.S. Cl.
CPC .............. *G11C 16/16* (2013.01); *G11C 16/04* (2013.01); *G11C 16/0483* (2013.01); *G11C 16/08* (2013.01); *G11C 16/24* (2013.01); *G11C 16/30* (2013.01); *G11C 16/32* (2013.01); *G11C 16/0466* (2013.01)

(58) Field of Classification Search
CPC ......... G11C 16/16; G11C 16/04; G11C 16/08; G11C 16/30
USPC ...................................... 365/185.33
See application file for complete search history.

(56) References Cited

U.S. PATENT DOCUMENTS

| | | | |
|---|---|---|---|
| 2010/0124116 A1* | 5/2010 | Maeda ............... | G11C 5/02 365/185.11 |
| 2016/0035741 A1 | 2/2016 | Tajima et al. | |
| 2016/0099063 A1* | 4/2016 | Shim ................. | G11C 16/14 365/185.19 |

FOREIGN PATENT DOCUMENTS

| | | |
|---|---|---|
| KR | 101149619 | 5/2012 |
| KR | 1020120131653 | 12/2012 |
| KR | 1020130072076 | 7/2013 |

* cited by examiner

*Primary Examiner* — Anthan Tran
(74) *Attorney, Agent, or Firm* — IP & T Group LLP

(57) ABSTRACT

Provided herein may be a semiconductor memory device. The semiconductor memory device may include: a memory cell array including a plurality of memory blocks; a peripheral circuit configured to apply an erase voltage to a source line and a plurality of select lines of a selected memory block among the plurality of memory blocks during an erase operation; and a control logic configured to control the peripheral circuit to form a trap in an area below at least one of a plurality of source select transistors included in the selected memory block, before the erase voltage is applied to the selected memory block.

11 Claims, 9 Drawing Sheets

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2017-0046141 filed on Apr. 10, 2017, in the Korean Intellectual Property Office, the entire disclosure of which is Incorporated herein by reference.

BACKGROUND

1. Field of Invention

Various embodiments of the present disclosure relate to an electronic device and, more particularly, to a semiconductor memory device and a method of operating the same.

2. Description of Related Art

Semiconductor memory devices are classified into volatile and nonvolatile memory devices.

A nonvolatile memory device can retain data stored therein even when power supply is interrupted, although read/write speeds are comparatively low. Therefore, a nonvolatile memory device is used when there is the need for storing data which must be retained regardless of whether or not it is connected to a power supply. Representative examples of the nonvolatile memory device may include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). Flash memory is classified into NOR and NAND type.

The flash memory has both advantages of a RAM in which data is programmable and erasable and advantages of a ROM in which data stored therein can be retained even when power is interrupted. Flash memory is widely used as a storage medium of portable electronic devices such as digital cameras, personal digital assistants (PDAs) and MP3 players.

SUMMARY

Various embodiments of the present disclosure are directed to a semiconductor memory device capable of improving the efficiency of an erase operation thereof, and a method of operating the same.

An embodiment of the present disclosure may provide for a semiconductor memory device including: a memory cell array including a plurality of memory blocks; a peripheral circuit configured to apply an erase voltage to a source line and a plurality of select lines of a selected memory block among the plurality of memory blocks during an erase operation; and a control logic configured to control the peripheral circuit to form a trap in an area below at least one of a plurality of source select transistors included in the selected memory block, before the erase voltage is applied to the selected memory block.

An embodiment of the present disclosure may provide for a semiconductor memory device including: a memory string comprising a source select transistor, a plurality of memory cells, a dram select transistor coupled in series between a source line and a bit line; a page buffer coupled to the bit line; a voltage generation circuit configured to apply first and second source line control voltages, a pre-erase voltage, and an erase voltage to the source line; and an address decoder configured to apply first and second setting voltages generated by the voltage generation circuit to the source select transistor. Before the pre-erase voltage and the erase voltage are applied to the source line, the first source line control voltage may be applied to the source line, and the first setting voltage may be applied to the source select transistor.

An embodiment of the present disclosure may provide for a method of operating a semiconductor memory device, including: forming an interface trap in a channel area below a source select transistor by applying a first source line control voltage to a source line of a selected memory block among, a plurality of memory blocks and applying a first setting voltage to at least one first source select transistor disposed at an outermost position among a plurality of source select transistors of the selected memory block; removing holes piled up in the channel area by applying a second source line control voltage to the source line and by applying a second setting voltage to the first source select transistor and a second source select transistor adjacent to the first source select transistor, or the first source select transistor and a memory cell adjacent to the first source select transistor; and erasing the selected memory block by applying an erase voltage to the source line and by controlling word lines of the selected memory block from a floating state to a ground voltage state.

DETAILED DESCRIPTION

Advantages and features of the present disclosure, and methods for achieving the same will become clear with reference to exemplary embodiments which are described later in detail together with the accompanying drawings. It is noted, however, that the present disclosure is not limited to the following embodiments but may be embodied in other types. Rather, these embodiments are provided so that the present disclosure will be thorough and complete, and will fully convey the technical spirit of the disclosure to those skilled in the art.

It will be understood that when an element is referred to as being "coupled" or "connected" to another element, it can be directly coupled or connected to the other element or intervening elements may be present therebetween.

Figure 1:
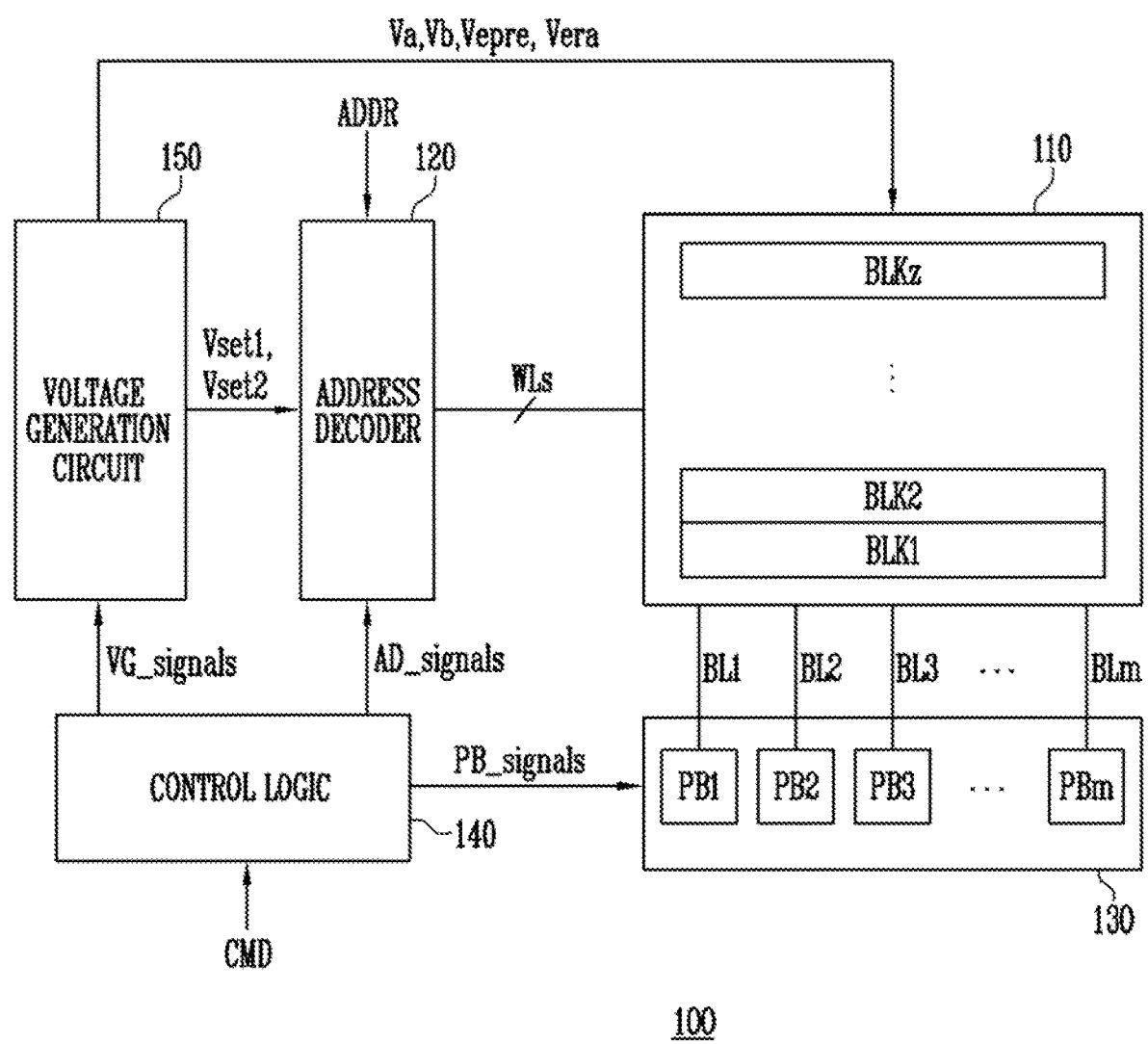
FIG. 1 is a block diagram illustrating a semiconductor memory device in accordance with an embodiment of the present disclosure.

FIG. 1 is a block diagram illustrating a semiconductor memory device 100 in accordance with an embodiment of the present disclosure.

Referring to FIG. 1, the semiconductor memory device 100 may include a memory cell array 110, an address decoder 120, a read write circuit 130, a control logic 140, and a voltage generation circuit 150.

The address decoder 120, the read/write circuit 130, and the voltage generation circuit 150 may be defined as peripheral circuits configured to perform an erase operation on the memory cell array 110.

The memory cell array 110 may include a plurality of memory blocks BLK1 to BLKz. The memory blocks BLK1 to BLKz may be coupled to the address decoder 120 through word lines WLs. The memory blocks BLK1 to BLKz may be coupled to the read/write circuit 130 through bit lines BL1 to BLm. Each of the memory blocks BLK1 to BLKz may include a plurality of memory cells. In an embodiment, the memory cells may be nonvolatile memory cells, and in particular, the memory cells may be charge trap device-based nonvolatile memory cells. A plurality of memory cells which are coupled in common to each word line may be defined as one page. The memory cell array 110 may include a plurality of pages. Each of the memory blocks BLK1 to BLKz of the memory cell array 110 may include a plurality of memory strings. Each of the memory strings may include at least one drain select transistor, a plurality of memory cells, and at least one source select transistor which are coupled in series between a bit line and a source line.

The address decoder 120 may be coupled to the memory cell array 110 through the word lines WLs. The address decoder 120 may operate in response to an address signal ADDR and address control signals AD_signals outputted from the control logic 140. The address decoder 120 may receive the address signal ADDR through an input/output buffer (not shown) provided in the semiconductor memory device 100.

The erase operation of the semiconductor memory device 100 may be performed on a memory block basis. During the erase operation, the plurality of memory blocks BLK1 to BLKz may be erased at the same time, or at least one of the memory blocks BLK1 to BLKz may be erased.

When an address signal ADDR is received according to a request for an erase operation of the semiconductor memory device the address signal ADDR may include a block address. The address decoder 120 may select at least one memory block in response to the block address.

During an erase operation, the address decoder 120 may apply a first setting voltage Vset1 and a second setting voltage Vset2 generated by the voltage generation circuit 150 to select at least one select line of a selected memory block according to the block address included in the address signal ADDR, and may control word lines or select lines of the selected memory block to float.

The read/write circuit 130 may include a plurality of page buffers PB1 to PBm. The plurality of page buffers PB1 to PBm may be coupled to the memory cell array 110 through a plurality of corresponding bit lines BL1 to BLm. The page buffers PB1 to PBm may control the bit lines BL1 to BLm of the selected memory block to float during an erase operation.

The read/write circuit 130 may operate in response to buffer control signals PB_signals outputted from the control logic 140.

The control logic 140 may be coupled to the address decoder 120, the read/write circuit 130, and the voltage generation circuit 150. The control logic 140 may receive a command CMD through an input/output buffer (not shown) of the semiconductor memory device 100. The control logic 140 may control the overall operation of the semiconductor memory device 100 in response to the command CMD.

When a command CMD corresponding to an erase operation is inputted, the control logic 140 may generate and output control signals AD_signals, PB_signals, and VG_signals so as to erase at least one selected memory block according to an erase algorithm stored in the control logic 140.

Particularly, during an erase operation, the control logic 140 may generate and output voltage control signals VG_signals for controlling the voltage generation circuit 150 to generate the first and second setting voltages Vset1 and Vset2 to be applied to a select line of a selected memory blocks and first and second source line control voltages Va and Vb to be applied to a source line of the selected memory block so that an interface trap can be formed in an area below a select transistor of the selected memory block.

In an embodiment of the present disclosure, during an erase operation, the control logic 140 may control the read/write circuit 130 such that an erase voltage Vera and a pre-erase voltage Vepre to be applied to the source line is also applied to the bit lines BL1 to BLm. The pre-erase voltage Vepre and the erase voltage Vera may be applied to the bit lines BL1 to BLm in lieu of the source line, or may be applied to both the source line and the bit lines BL1 to BLm at the same time.

The voltage generation circuit 150 may operate in response to the voltage control signals VG_signals outputted from the control logic 140.

During an erase operation, the voltage generation circuit 150 may generate the first and second setting voltages Vset1 and Vset2 to be: applied to a select line of a selected memory block under the control of the control logic 140, and sequentially generate the first and second source line control voltages Va and Vb, the pre-erase voltage Vepre, and the erase voltage Vera to be applied to the source line of the memory cell array 110 and then provide them to the source line of the memory cell array 110.

Figure 2:
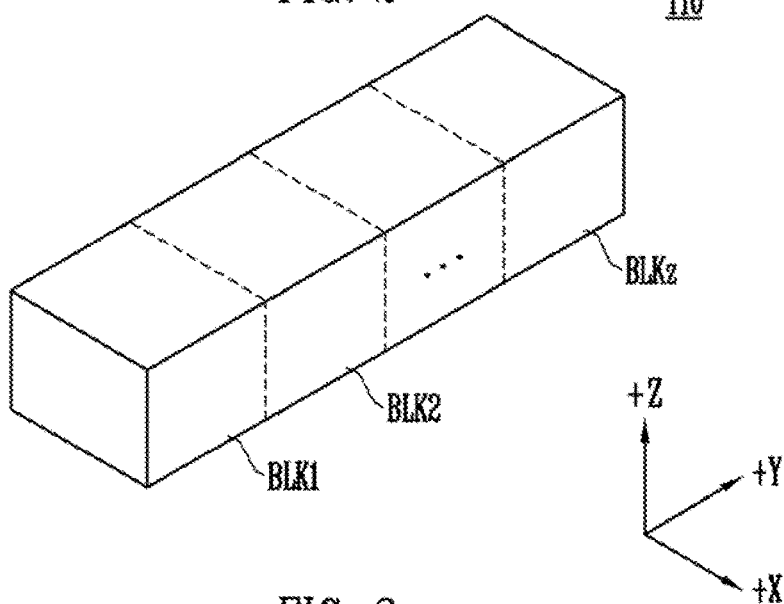
FIG. 2 is a diagram illustrating an embodiment of a memory cell array shown n FIG. 1.

FIG. 2 is a diagram illustrating an embodiment of the memory cell array 110 of FIG. 1.

Referring to FIG. 2, the memory cell array 110 may include a plurality of memory blocks BLK1 to BLKz. Each memory block may have a three-dimensional structure. Each memory block may include a plurality of memory cells stacked on a substrate. The memory cells are arranged in +X, +Y, and +Z directions. The structure of each memory block will be described in more detail later herein with reference to FIGS. 3 and 4.

Figure 3:
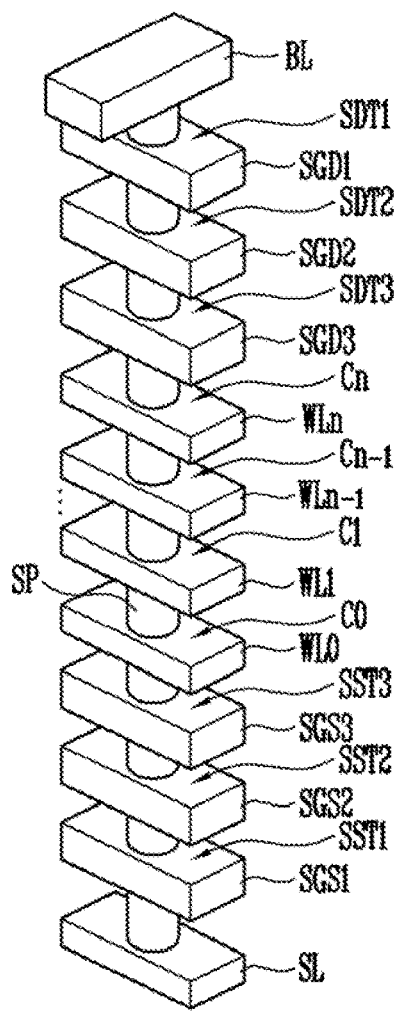
FIG. 3 is a perspective view illustrating a memory string included in a memory block in accordance with an embodiment of the present disclosure.
Figure 4:
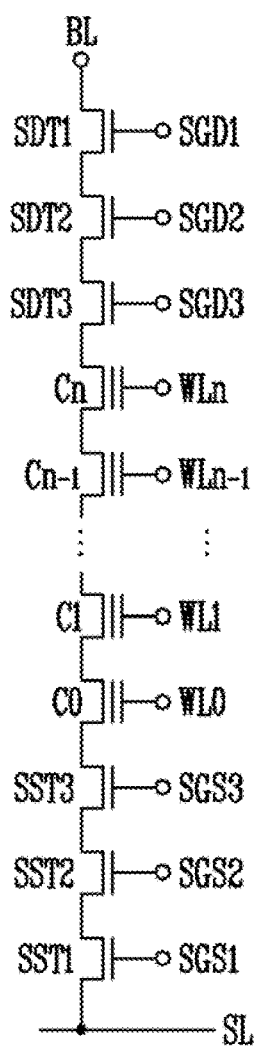
FIG. 4 is a circuit diagram illustrating the memory string shown in FIG. 3.

FIG. 3 is a perspective view illustrating a memory string included in a memory block in accordance with the present disclosure. FIG. 4 is a circuit diagram illustrating the memory string shown in FIG. 3.

Referring to FIGS. 3 and 4, a source line SL may be formed on a semiconductor substrate (not shown). A vertical channel layer SP may be formed on the source line SL. An upper portion of the vertical channel layer SP may be coupled to a corresponding bit line BL. The vertical channel layer SP may be made of polysilicon. A plurality of conductive layers SGS1, SGS2, SGS3, WL0 to WLn, SGD3, SGD2, and SGD1 may be formed at different heights on the vertical channel layer SP in such a way that each conductive layer encloses the vertical channel layer SP. The plurality of conductive layers SGS1, SGS2, SGS3, WL0 to WLn, SGD3, SGD2, and SGD1 may be spaced apart at a regular interval along the vertical channel layer SP. Multi-layer (not shown) including a tunnel insulating layer and a charge storage layer may be formed on a surface of the vertical channel layer SP. The multi-layer may be also disposed between the vertical channel layer SP and the conductive layers SGS1, SGS2, SGS3, WL0 to WLn, SGD3 SGD2, and SGD1. The multilayer may be formed in an ONO structure in which an oxide layer, a nitride layer, and an oxide layer are successively stacked. The plurality of conductive layers WL0 to WLn may be defined as word lines coupled with memory cells C0 to Cn. The conductive layers SGS1, SGS2, and SGS3 may be defined as source select lines coupled with source select transistors SST1, SST2, and SST3. The conductive layers SGD1, SGD2, and SGD3 may be defined as drains select lines coupled with drain select transistors SDT1, SDT2, and SDT3.

The lowermost conductive layer may form the source select line SGS1. The uppermost conductive layer may form the drain select line SGD1. The conductive layers disposed between the select lines SGS3 and SGD3 may form: the respective word lines WL0 to WLn. In other words, the conductive layers SGS1, SGS2, SGS3, WL0 to WLn, SGD3, SGD2, and SGD1 may be formed in a multilayer structure on the semiconductor substrate. The vertical channel layer SP passing through the conductive layers SGS1, SGS2, SGS3, WL0 to WLn, SGD3, SGD2, and SGD1 may vertically couple the bit line BL and the source line SL which are formed on the semiconductor substrate.

The drain select transistors SDT1 to SDT3 may be formed on portions of the respective upper conductive layers SGD1 to SGD3 that enclose the vertical channel layer SP. The source select transistors SST1 to SST3 may be formed on portions of the respective lower conductive layers SGS1 to SGS3 that enclose the vertical channel layer SP. The memory cells C0 to Cn may be formed on portions of the respective intermediate conductive layers WL0 to WLn that enclose the vertical channel layer SP.

In this way, the memory string may include the source select transistors SST1 to SST3, the memory cells C0 to Cn, and the drain select transistors SDT1 to SDT3 which are vertically coupled to the substrate between the source line SL and the bit line BL.

In the foregoing embodiment of the present disclosure, there has been illustrated an example in which three source select transistors and three drain select transistors are provided, but it is noted that the number of the source and the drain select transistors may vary. For example, only at least one source select transistor and at least one drain select transistor may be provided.

Figure 5:
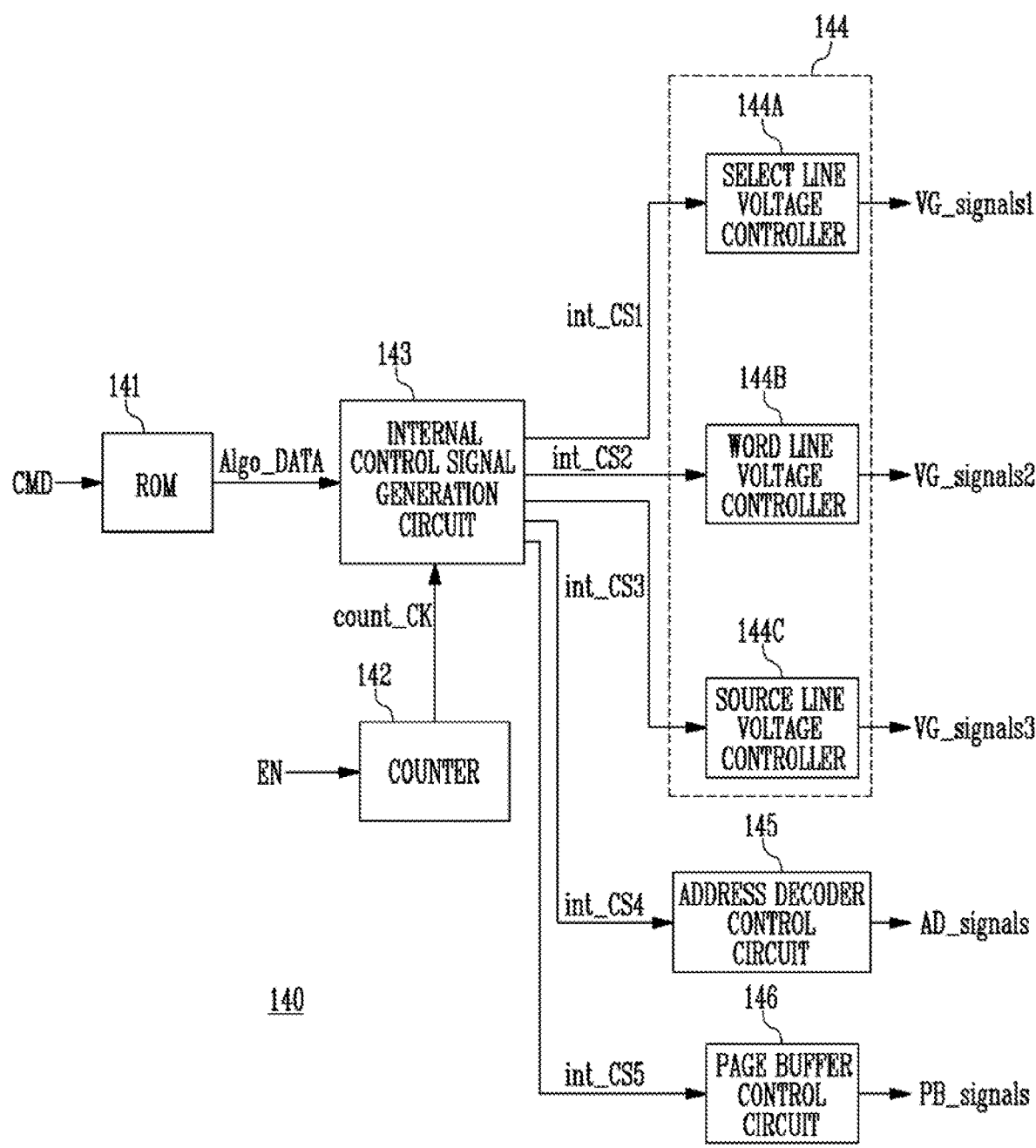
FIG. 5 is a block diagram illustrating an embodiment of a control logic shown in FIG. 1.

FIG. 5 is a block diagram illustrating an embodiment of the control logic 140 of FIG. 1.

Referring to FIG. 5, the control logic 140 may include a read-only memory (ROM) 141, a counter 142, an internal control signal generation circuit 143, a voltage generation control circuit 144, an address decoder control circuit 145, and a page buffer control circuit 146.

The ROM 141 may store an algorithm for performing overall operation of the semiconductor memory device, and output algorithm data Algo_DATA of the performed operation to the internal control signal generation unit 143. The operation to be performed may be based on a command CMD inputted from an external device, e.g., a host coupled to the semiconductor memory device.

The counter 142 may count internal clocks in response to an enable signal EN and generate and output a count clock count_CK.

The internal control signal generation circuit 143 may generate and output first to fifth internal control signals int_CS1 to int_CS5 in response to the algorithm data Algo_DATA received from the ROM 141 and the count clock count_CK received from the counter 142.

The voltage generation control circuit 144 may generate and output first to third control signals VG_signals1, VG_signals2, and VG_signals3 in response to the first to third internal control signals int_CS1 to int_CS3, respectively. The first to third control signals VG_signals1, VG_signals2, and VG_signals3 may be signals included in the voltage control signals VG_signals for controlling the voltage generation circuit 150 of FIG. 1.

The voltage generation control circuit 144 may include a select line voltage controller 144A, a word line voltage controller 144B, and a source line voltage controller 144C.

The select line voltage controller 144A may generate and output the first control signals VG_signals1 in response to the first internal control signal int_CS1. The first control signals VG_signals1 may be signals for controlling the voltage generation circuit 150 of FIG. 1 to generate voltages, e.g., the first and second setting voltages Vset1 and Vset2, to be applied to a plurality of drain select lines and a plurality of source select lines of a selected memory block.

The word line voltage controller 144B may generate and output the second control signals VG_signals2 in response to the second internal control signal int_CS2. The second control signals VG_signals2 may be signals for controlling the voltage generation circuit 150 of FIG. 1 to generate voltages to be applied to a plurality of word lines of a selected memory block.

The source line voltage controller 144C may generate and output the third control signals VG_signals3 in response to the third internal control signal int_CS3. The third control signals VG_signals3 may be signals for controlling the voltage generation circuit 150 of FIG. 1 to generate voltages, e.g., the first and second source line control voltages Va and Vb, the pre-erase voltage Vepre, and the erase voltage Vera, to be applied to a source line coupled with the memory cell array 110.

The address decoder control circuit 145 may generate and output the address control signals AD_signals in response to the fourth internal control signal int_CS4. The address control signals AD_signals may be used to control the address decoder 120 shown in FIG. 1.

The page buffer control circuit 146 may generate and output the buffer control signals PB_signals in response to the fifth internal control signal int_CS5. The buffer control signals PB_signals may be used to control the read/write circuit 130 shown in FIG. 1.

Figure 6:
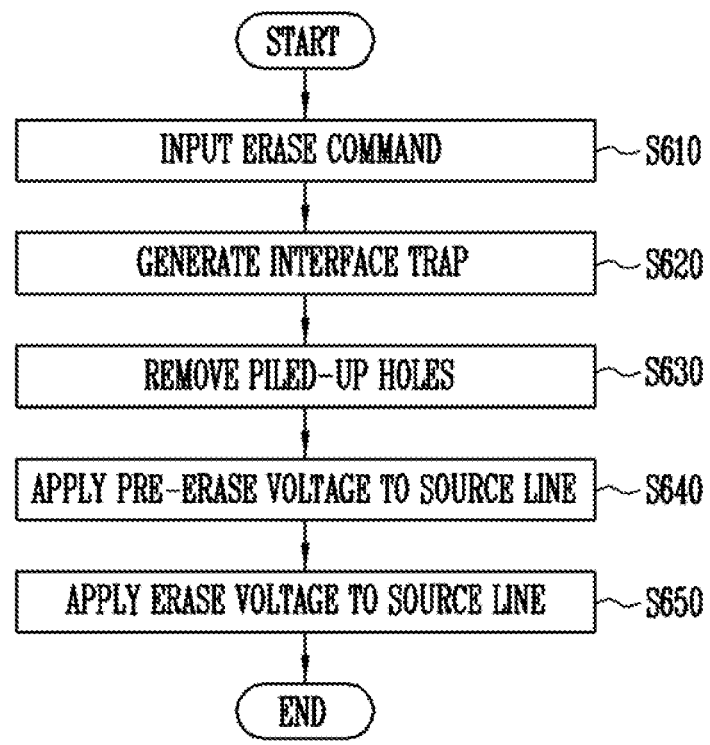
FIG. 6 is a flowchart illustrating an operation of a semiconductor memory device in accordance with an embodiment of the present disclosure.

FIG. 6 is a flowchart illustrating an operation of a semiconductor memory device in accordance with an embodiment of the present disclosure.

Figure 7:
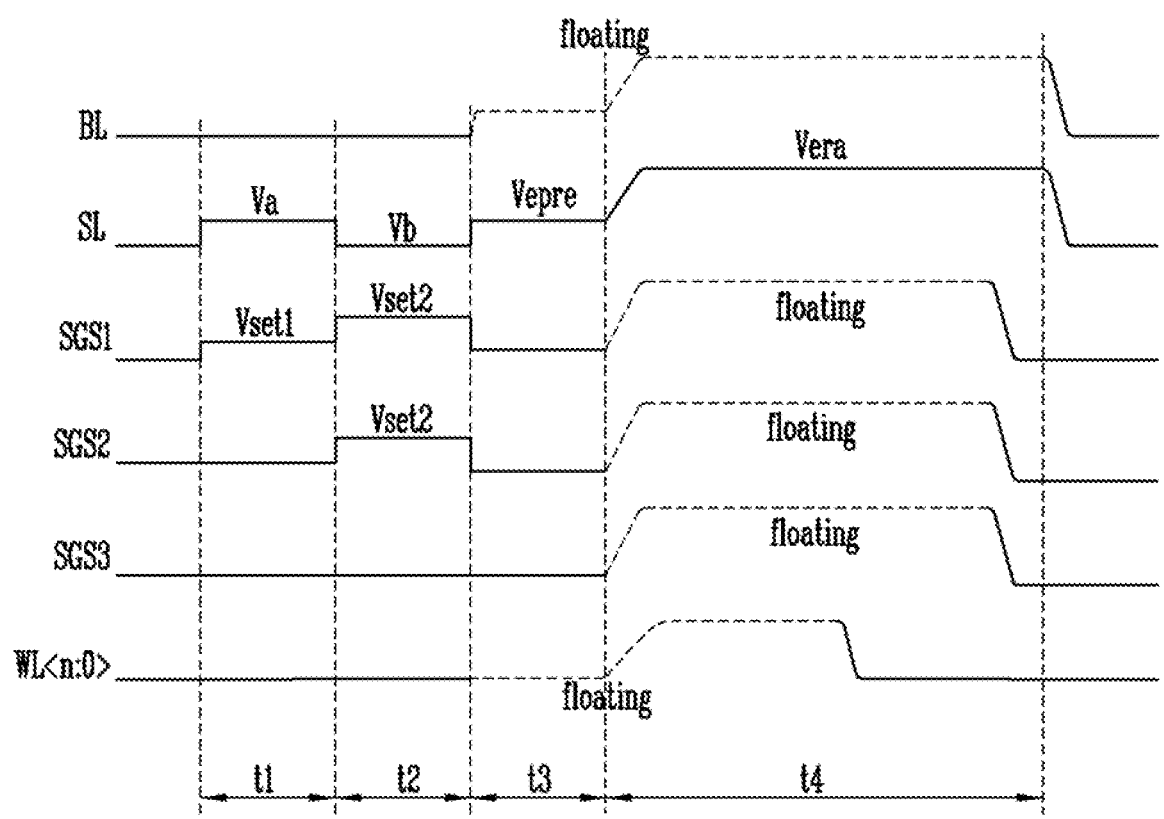
FIG. 7 is a waveform diagram illustrating an operation of a semiconductor memory device in accordance with an embodiment of the present disclosure.

FIG. 7 is a waveform diagram illustrating an operation of a semiconductor memory device in accordance with an embodiment of the present disclosure.

Figure 8:
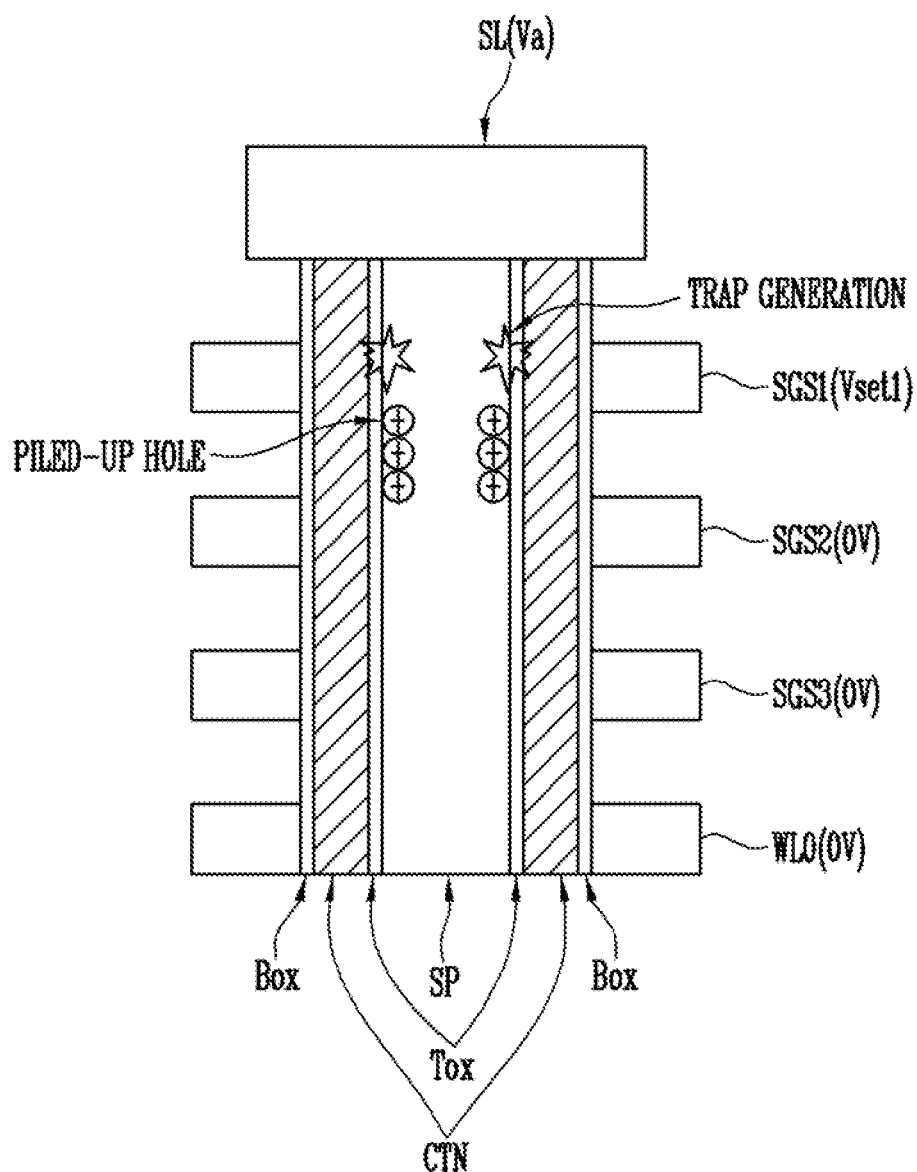
FIG. 8 is a sectional diagram of a memory string to illustrate an operation in a first period shown in FIG. 7.

FIG. 8 is a sectional diagram of a memory string to illustrate an operation in a first period t1 shown in FIG. 7.

Figure 9:
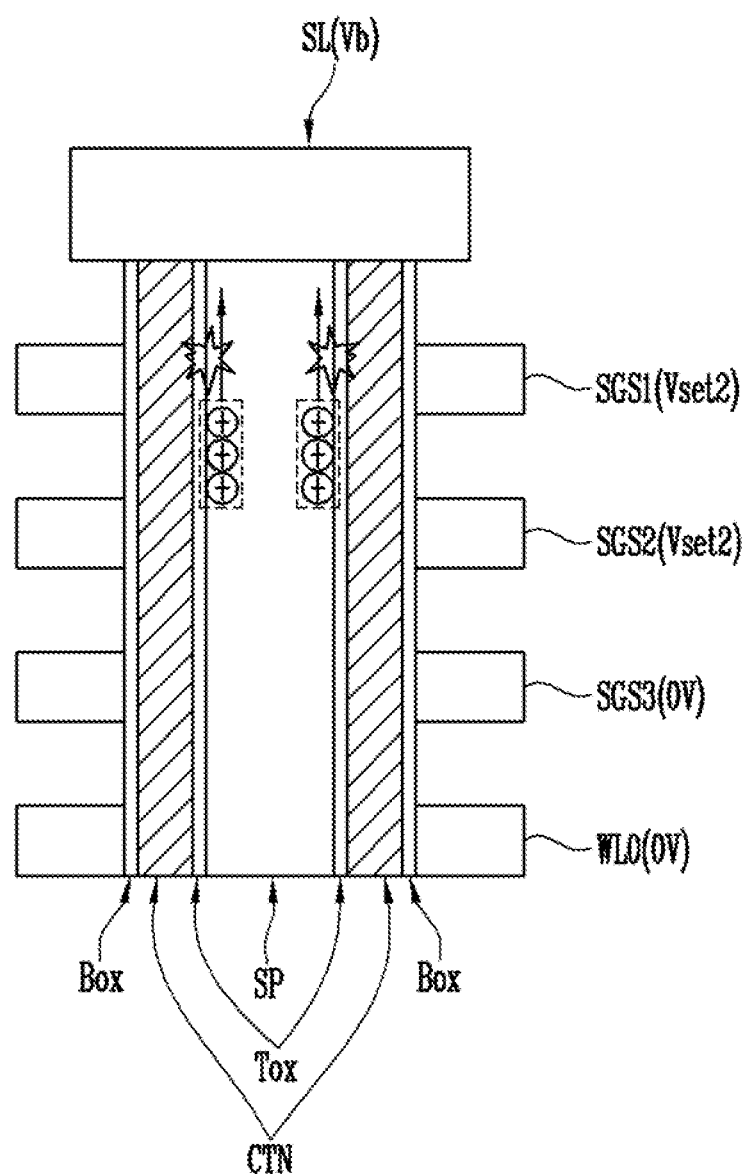
FIG. 9 is a sectional diagram of a memory string to illustrate an operation in a second period shown in FIG. 7.

FIG. 9 is a sectional diagram of a memory string to illustrate an operation in a second period t2 shown in FIG. 7.

The erase operation of the semiconductor memory device in accordance with an embodiment of the present disclosure will be described with reference to FIGS. 1 to 9.

When a command CMD for an erase operation is inputted from the external device, at step S610, the control logic 140 controls the peripheral circuits, i.e., the address decoder 120, the read/write circuit 130, and the voltage generation circuit 150, to perform an erase operation of the semiconductor memory device 100.

The ROM 141 of the control logic 140 outputs algorithm data Algo_DATA corresponding to an erase algorithm in response to the command CMD for the erase operation. The internal control signal generation circuit 143 may generate and output first to fifth internal control signals int_CS1 to int_CS5 in response to the algorithm data Algo_DATA and a count clock count_CK. The voltage generation control circuit 144 may generate and output first to third control signals VG_signals1, VG_signals2, and VG_signals3 in response to the first to third internal control signals int_CS1 to int_CS3.

In the first period t1 of FIG. 7, the voltage generation circuit 150 may generate and output, in response to the first to third control signals VG_signals1, VG_signals2, and VG_signals3, a first source line control voltage Va to be applied to the source line SL of the memory cell array 110, and a first setting voltage Vset1 to be applied to the source select line SGS1 coupled with the source select transistor SST1 that is disposed at the outermost position among the plurality of source select transistors SST1 to SST3. In the embodiment of the present disclosure, there has been illustrated the case where the first setting voltage Vset1 is applied to a single source select transistor SST1. However, the first setting voltage Vset1 may be applied to two source select transistors SST1 and SST2 or three source select transistors SST1, SST2, and SST3 which are disposed at the outermost side. The first source line control voltage Va may have a potential level ranging from approximately 3 V to approximately 5 V. The first setting voltage Vset1 may have a potential level ranging from approximately 0.1 V to approximately 0.5 V.

Referring to FIG. 8, a multi-layer including a tunnel insulating layer Tox, a charge storage layer CTN, and a blocking insulating layer Box may be formed on a surface of the vertical channel layer SP. That is, the tunnel insulating layer Tox, the charge storage layer CTN, and the blocking insulating layer Box may be disposed between the vertical channel layer SP and conductive layers SGS1, SGS2, SGS3 and WL0. During an erase operation of the semiconductor memory device, in the first period t1, if the first source line control voltage Va is applied to the source line SL and the first setting voltage Vset1 is applied to the source select line SGS1 coupled with the outermost source select transistor SST1, traps are formed in an interface area between the vertical channel layer SP and the tunnel insulating layer Tox by ions moved from the vertical channel layer SP to the tunnel insulating layer Tox, at step S620. Holes may be piled up around a portion of the vertical channel layer SP below the first source select transistor SST1. Here, 0 V may be applied to the source select lines SGS2 and SGS3 and the plurality of word lines WL0 to WLn so as to maintain the source select transistors SST2 and SST3 and the memory cells C0 to Cn in a turned-off state.

In the second period t2 of FIG. 7, the voltage generation circuit 150 may generate and output, in response to the first to third control signals VG_signals1, VG_signals2, and VG_signals3, a second source line control voltage Vb to be applied to the source line SL of the memory cell array 110, and a second setting voltage Vset2 to be applied to the source select lines SGS1 and SGS2 coupled with the source select transistors SST1 and SST2 that are disposed at the outermost position among the plurality of source select transistors SST1 to SST3. In an embodiment, the second setting voltage Vset2 may be applied to the source select transistor SST1 to which the first setting voltage Vset1 has been applied, and the source select transistor SST2 disposed adjacent to the source select transistor SST1. For example, in the case where the first setting voltage Vset1 is applied to the source select transistors SST1 and SST2, the second setting voltage Vset2 may be applied to the source select transistors SST1 to SST3. In the case where the first setting voltage Vset1 is applied to the source select transistors SST1 to SST3, the second setting voltage Vset2 may be applied to the source select transistors SST1 to SST3 and the memory cell C0. The source select transistors ST1 and SST2 may be turned on by the second setting voltage Vset2. The second setting voltage Vset2 may have a potential level ranging from approximately 3 V to approximately 5 V. That is, the second setting voltage Vset2 is a turn-on voltage for turning on the source select transistors SST1 and SST2. The second source line control voltage Vb may be a ground voltage of 0V.

Referring to FIG. 9, in the second period t2, if the second source line control voltage Vb is applied to the source line SL and the second setting voltage Vset2 is applied to the source select lines SGS1 and SGS2 coupled with the source select transistors SST1 and SST2, the holes piled-up around the vertical channel layer SP below the first source select transistor SST1 are removed through the source line SL to which the second source line control voltage Vb is applied, at step S630.

In a third period t3, the address decoder 120 controls the word lines WL0 to WLn to float in response to address control signals AD_signals, and the re d/write circuit 130 controls bit lines BL1 to BLm to float in response to buffer control signals PB_signals.

The voltage generation circuit 150 generates a pre-erase voltage Vepre and applies it to the source line SL in response to the third control signals VG_signals3 in the third period t3, at step S640. Gate-induced drain leakage (GIDL) current is generated in the vertical channel layer SP below the source select transistor SST1 by the pre-erase voltage Vepre applied to the source line SL and then flows in a direction of the vertical channel layer SP. That is, hot holes are generated in a drain area of the source select transistor SST1 and drawn in the direction of the vertical channel layer SP, whereby the potential of the vertical channel layer SP is increased. Here, since the traps have been formed below the source select transistor SST1, GIDL current may be easily generated, and the amount of current is increased. Furthermore, the bit lines BL1 to BLm that are in the floating state may be increased in potential level by a coupling phenomenon due to the pre-erase voltage Vepre applied to the source line SL.

Thereafter, in a fourth period t4, the voltage generation circuit 150 generates an erase voltage Vera higher than the pre-erase voltage Vepre and applies it to the source line SL of the selected memory block in response to the third control signals VG_signals3, at step S650. Thereby, the potential level of the vertical channel layer SP is further increased.

Here, the potential level of the bit lines BL1 to BLm may be further increased by a coupling phenomenon due to the erase voltage Vera applied to the source line SL.

The address decoder 120 controls the source select lines SGS1 to SGS3 to float in response to the address control signals AD_signals in the fourth period t4. Subsequently, the address decoder 120 controls the word lines WL<n:0> from a floating state to the ground voltage level in response to the address control signals AD_signals in the fourth period t4. Consequently, electrons stored in the charge storage layers CTN adjacent to the memory cells C0 to Cn are detrapped by the vertical channel layer SP having a high potential level and the word lines WL<n:0> having the ground voltage level. In other words, data stored in the memory cells C0 to Cn are erased.

Thereafter, the source select lines SGS1 to SGS3 are controlled from the floating state to the ground voltage level so that the source select transistors SST1 to SST3 are turned off. As a result, the erase operation is terminated.

As described above, in an embodiment of the present disclosure, in the case where an erase operation is performed in such a way that a pre-erase voltage Vepre and an erase voltage Vera are applied to the source line SL, the first setting voltage Vset1 is applied to the source select line SGS1 and the first source line control voltage Va is applied to the source line SL before applying the pre-erase voltage Vepre to the source line SL. Thus, traps are formed in an interface area between the vertical channel layer SP and the tunnel insulating layer Tox below the source select transistor SST1, thus facilitating generation of GIDL current.

Here, in an embodiment, in the case where an erase operation is performed in such a way that a pre-erase voltage Vepre and an erase voltage Vera are applied to the bit lines BL1 to BLm in lieu of the source line SL, the first setting voltage Vset1 is applied to the drain select line SGD1 and the first source line control voltage Va is applied to the bit lines BL1 to BLm before applying the pre-erase voltage Vepre to the bit lines BL1 to BLm. Thus, traps are formed in an interface area between the vertical channel layer SP and the tunnel insulating layer Tox below the drain select transistor SDT1, thus facilitating generation of GIDL current. In this way, an effect similar to that of the foregoing embodiment can be obtained.

Figure 10:
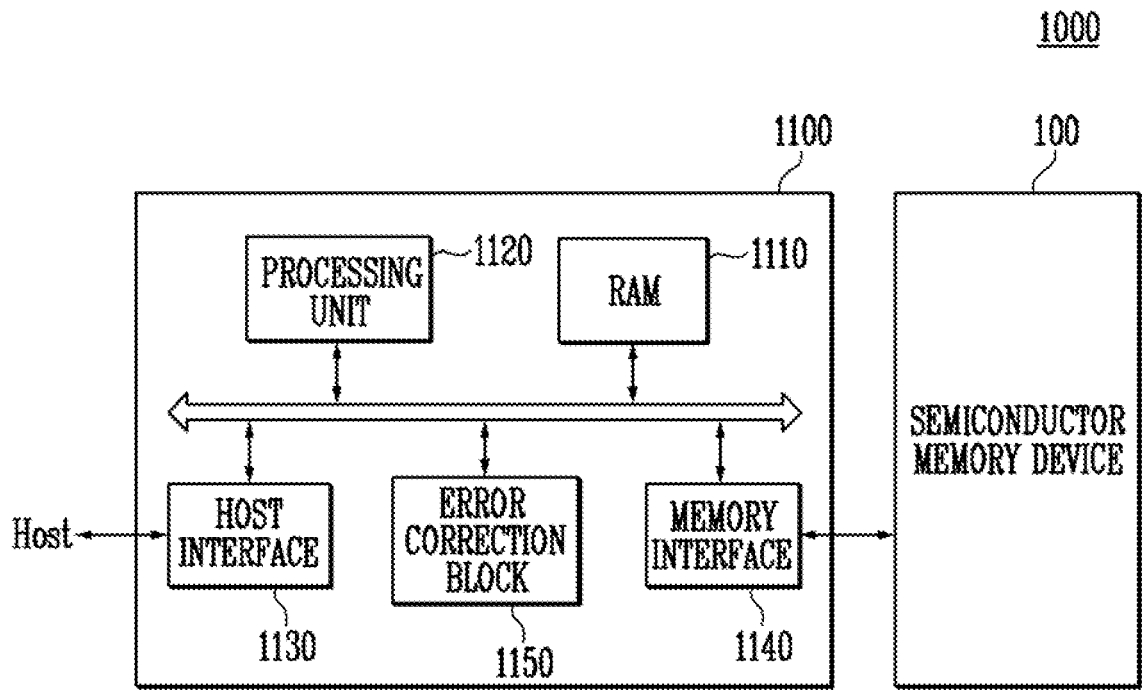
FIG. 10 is a block diagram illustrating a memory system including the semiconductor memory device shown in FIG. 1, according to an embodiment of the present invention.

FIG. 10 is a block diagram illustrating a memory system 1000 including the semiconductor memory device 100 shown in FIG. 1.

Referring FIG. 10, the memory system 1000 may include a semiconductor memory device 100 and a controller 1100.

The semiconductor memory device 100 may have the same configuration and operation as those of the semiconductor memory device described with reference to FIG. 1. Hereinafter, repetitive detailed description will be omitted.

The controller 1100 may be coupled to a host Host and the semiconductor memory device 100. The controller 1100 may access the semiconductor memory device 100 in response to a request from the host Host. For example, the controller 1100 may control read, write, erase, and background operations of the semiconductor memory device 100. The controller 1100 may provide an interface between the host Host and the semiconductor memory device 100. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of operation memory of the processing unit 1120, a cache memory between the semiconductor memory device 100 and the host Host, and a buffer memory between the semiconductor memory device 100 and the host Host. The processing unit 1120 may control the overall operation of the controller 1100. In addition, the controller 1100 may temporarily store program data provided from the host Host during a write operation.

The host interface 1130 may include a protocol for performing data exchange between the host Host and the controller 1100. In an embodiment, the controller 1100 may communicate with the host Host through at least one of various interface protocols such as a universal serial bus (USB) protocol, a multimedia card (MMC) protocol a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 may interface with the semiconductor memory device 100. For example, the memory interface may include a NAND interface or a NOR interface.

The error correction block 1150 may use an error correcting code (EEC) to detect and correct an error in data received from the semiconductor memory device 100. The processing unit 1120 may adjust the read voltage according to an error detection result from the error correction block 1150, and control the semiconductor memory device 100 to perform re-reading. In an embodiment, the error correction block may be provided as an element of the controller 1100.

The controller 1100 and the semiconductor memory device 100 may be integrated into a single semiconductor device. In an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMC-micro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD may include a storage device formed to store data in a semiconductor memory. When the memory system 1000 is used as the SSD, an operation speed of the host Host coupled to the memory system 1000 may be improved significantly.

In an embodiment, the memory system 1000 may be provided as one of various elements of an electronic device such as a computer, a ultra mobile PC (UMPC), a workstation, a net-book, personal digital assistants (PDA) a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form Chip On Board (COB), Ceramic Dual In Line Package (CERDIP) Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 11:
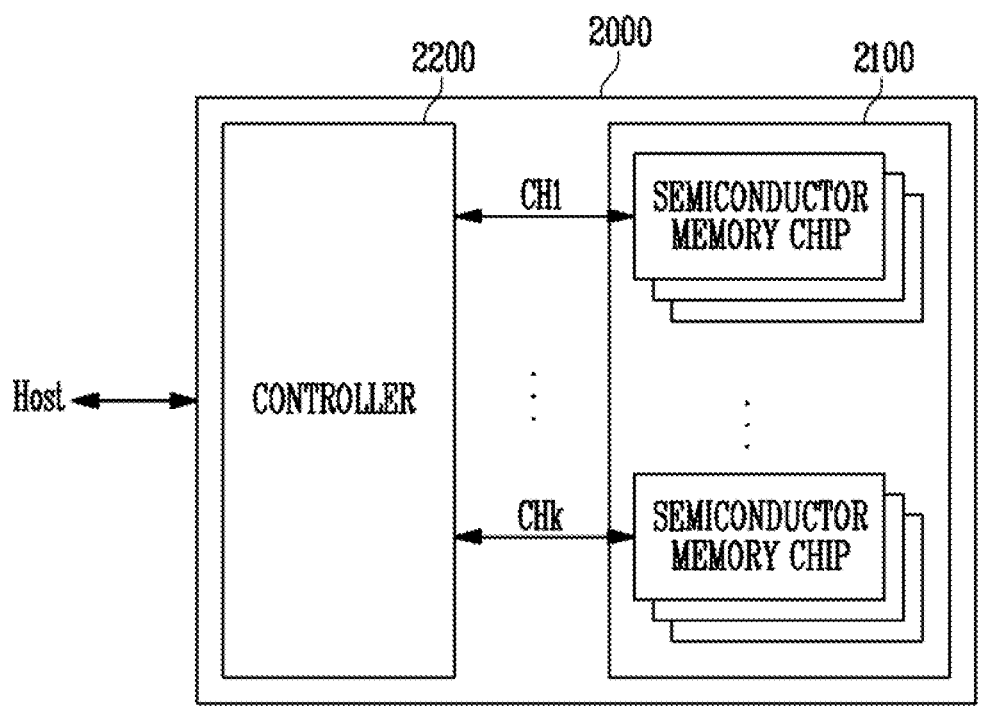
FIG. 11 is a block diagram illustrating a memory system according to an embodiment of the present invention.

FIG. 11 is a block diagram illustrating another embodiment of a memory system according to the present invention.

Referring FIG. 11, the memory system 2000 may include a semiconductor memory device 2100 and a controller 2200. The semiconductor memory device 2100 may include a plurality of memory chips. The semiconductor memory chips may be divided into a plurality of groups.

In FIG. 11, it is illustrated that the plurality of groups respectively communicate with the controller 2200 through first to k-th channels CH1 to CHk. Each semiconductor memory chip may have the same configuration as that of an embodiment of the semiconductor memory device 100 described with reference to FIG. 1.

Each group may communicate with the controller 2200 through one common channel. The controller 2200 may have the same configuration as that of the controller 1100 described with reference to FIG. 10 and may control a plurality of memory chips of the semiconductor memory device 2100 through the plurality of channels CH1 to CHk.

Figure 12:
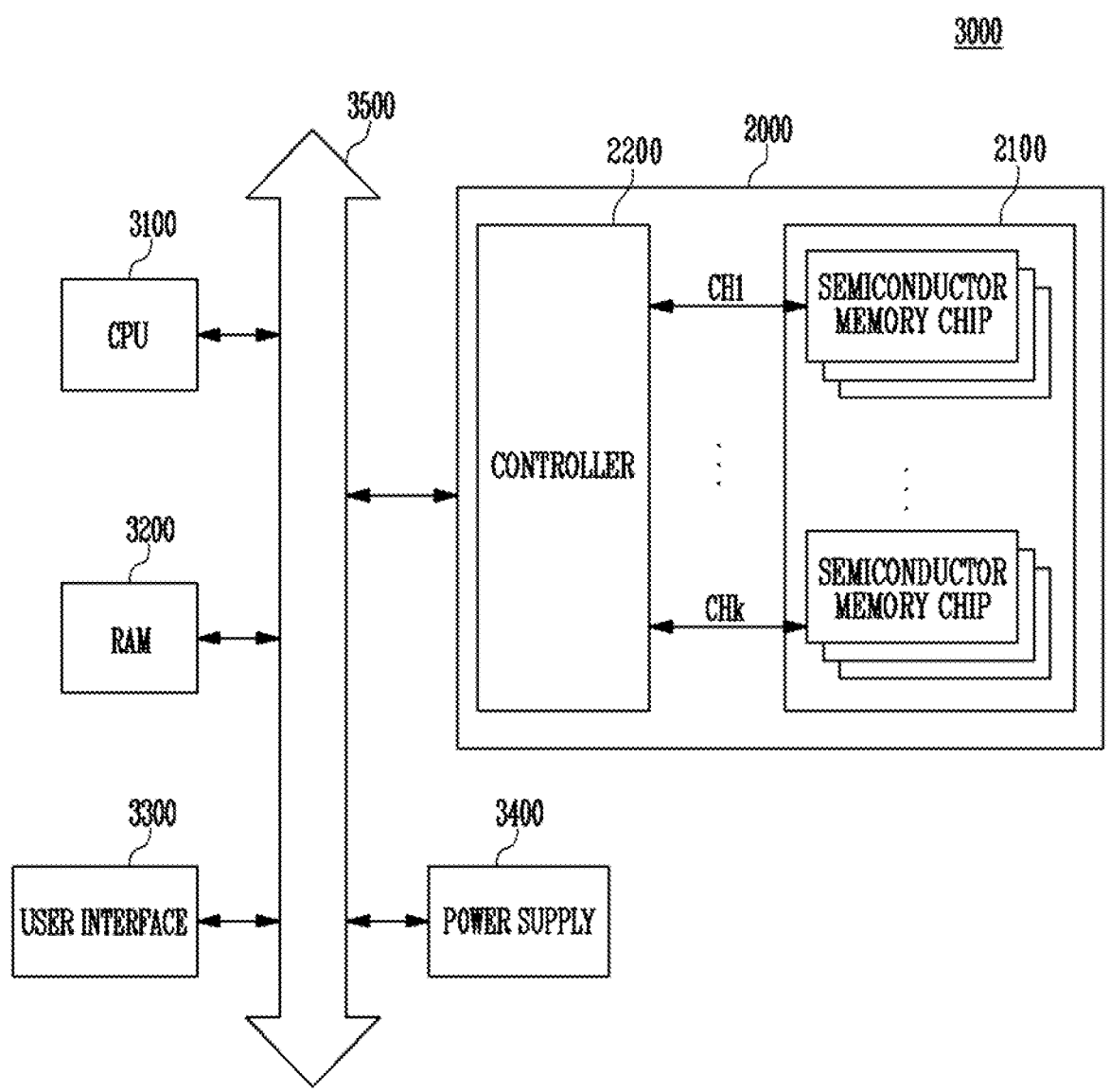
FIG. 12 is a block diagram illustrating a computing system including a memory system according to an embodiment of the present invention.

FIG. 12 is a block diagram illustrating a computing system 3000 including the memory system 2000 illustrated with reference to FIG. 11.

Referring to FIG. 12, the computing system 3000 may include a central processing unit 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 12, the semiconductor memory device 2100 is illustrated as being coupled to the system bus 3500 through the controller 2200. Furthermore, the semiconductor memory device 2100 may be directly coupled to the system bus 3500. The function of the controller 2200 may be performed by the CPU 3100 and the RAM 3200.

In FIG. 12, the memory system 2000 described with reference to FIG. 11 may be provided. Furthermore, the memory system 2000 may be replaced with the memory system 1000 described with reference to FIG. 10. In an embodiment, the computing system 3000 may include all of the memory systems 1000 and 2000 described with reference to FIGS. 10 and 11.

In accordance with the present disclosure, during an erase operation of a semiconductor memory device, a trap is formed between a channel and a tunnel insulating layer, thus facilitating generation of gate induced drain leakage (GIDL) current thereby enhancing the efficiency of the erase operation. Thereby, the time it takes to perform the erase operation and a required erase voltage can be reduced, so that electrical characteristics can be improved.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
   a memory block including a plurality of memory cell strings;
   a peripheral circuit configured to perform an erase operation on the memory block; and
   a control logic configured to control the peripheral circuit to apply operation voltages including first and second source line control voltages, a pre-erase voltage, and an erase voltage to a source line of the memory block sequentially to form a trap,
   wherein the pre-erase voltage is configured to be applied to the source line to generate a gate induced drain leakage current,
   wherein the erase voltage is configured to be applied to the source line to control memory cells of the memory block from a floating state to a ground voltage state, and
   wherein the first source line control voltage has a greater level than the second source line control voltage.

2. The semiconductor memory device according to claim 1,
   wherein each of the plurality of memory cell strings comprises at least one drain select transistor, a plurality of memory cells, and at least one source select transistor, which are coupled in series between a corresponding bit line and the source line.

3. The semiconductor memory device according to claim 1, wherein the peripheral circuit comprises:
   a voltage generation circuit configured to generate the first and second source line control voltages, the pre-erase voltage, and the erase voltage and apply the first and second source line control voltages, the pre-erase voltage, and the erase voltage to the source line, and configured to generate and output first and second setting voltages;
   an address decoder configured to apply the first and second setting voltages to at least one source select line of the plurality of memory cell strings, and control word lines of the memory block to float; and
   a read/write circuit coupled to bit lines of the memory block and configured to control the bit lines to float during the erase operation.

4. The semiconductor memory device according to claim 3,
   wherein the address decoder applies the first setting voltage to at least one first source select transistor disposed at an outermost position of a plurality of source select transistors included in the memory block, and wherein the address decoder applies the second setting voltage to the first source select transistor and a second source select transistor adjacent to the first source select transistor, or to the first source select transistor and a memory cell adjacent to the first source select transistor.

5. The semiconductor memory device according to claim 4, wherein the voltage generation circuit applies the first source line control voltage to the source line, and the address decoder applies the first setting voltage to the first source select transistor, so as to form the trap in an interface between a channel layer and a tunnel insulating layer below the first source select transistor.

6. The semiconductor memory device according to claim 4, wherein, after the trap is formed, the voltage generation circuit applies the second source line control voltage to the source line, and the address decoder applies the second setting voltage to the first source select transistor and the second source select transistor or the memory cell, so as to remove, though the source line, holes piled up in a channel layer.

7. The semiconductor memory device according to claim 4, wherein the second source line control voltage is a ground voltage, and the second setting voltage is a turn-on voltage for turning on the first source select transistor and the second source select transistor or the memory cell.

8. The semiconductor memory device according to claim 3, wherein, after the voltage generation circuit applies the second source line control voltage to the source line, the voltage generation circuit applies the pre-erase voltage to the source line and the address decoder controls the word lines of the memory block to float.

9. The semiconductor memory device according to claim 3, wherein, after the voltage generation circuit applies the pre-erase voltage to the source line, the voltage generation circuit applies the erase voltage to the source line and the address decoder maintains the source select line and the word lines of the memory block in the floating state for a predetermined time and thereafter controls the word lines to a ground voltage level.

10. The semiconductor memory device according to claim 3, wherein the control logic comprises:
a read-only memory (ROM) configured to store an algorithm and output algorithm data corresponding to an input command;
a counter configured to output a count clock in response to an enable signal;
an internal control signal generation circuit configured to output first to third internal control signals in response to the algorithm data and the count clock; and
a voltage generation control circuit configured to generate first to third control signals for controlling the voltage generation circuit in response to the first to third internal control signals.

11. The semiconductor memory device according to claim 10, wherein the voltage generation control circuit comprises:
a select line voltage controller configured to generate the first control signals for controlling the voltage generation circuit to generate the first and second setting voltages in response to the first internal control signals;
a word line voltage controller configured to generate the second control signals for controlling the voltage generation circuit to generate a voltage to be applied to the word lines of the memory block in response to the second internal control signals; and
a source line voltage controller configured to generate the third control signals for controlling the voltage generation circuit to generate the first and second source line control voltages, the pre-erase voltage, and the erase voltage in response to the third internal control signals.

* * * * *